(12) United States Patent
Huang et al.

(10) Patent No.: US 9,508,852 B2
(45) Date of Patent: Nov. 29, 2016

(54) RADIATION-HARDENED-BY-DESIGN (RHBD) MULTI-GATE DEVICE

(71) Applicant: Peking University, Beijing (CN)

(72) Inventors: Ru Huang, Beijing (CN); Weikang Wu, Beijing (CN); Xia An, Beijing (CN); Fei Tan, Beijing (CN); Liangxi Huang, Beijing (CN); Hui Feng, Beijing (CN); Xing Zhang, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 14/781,542

(22) PCT Filed: Sep. 30, 2013

(86) PCT No.: PCT/CN2013/084747
§ 371 (c)(1),
(2) Date: Sep. 30, 2015

(87) PCT Pub. No.: WO2014/161285
PCT Pub. Date: Oct. 9, 2014

(65) Prior Publication Data
US 2016/0027911 A1    Jan. 28, 2016

(30) Foreign Application Priority Data
Apr. 3, 2013    (CN) .......................... 2013 1 0115866

(51) Int. Cl.
*H01L 29/78* (2006.01)
*H01L 29/66* (2006.01)
(Continued)

(52) U.S. Cl.
CPC ......... *H01L 29/785* (2013.01); *H01L 27/0251* (2013.01); *H01L 29/0673* (2013.01); *H01L 29/66439* (2013.01); *H01L 29/66795* (2013.01); *H01L 29/775* (2013.01)

(58) Field of Classification Search
CPC ........... H01L 29/785; H01L 29/66795; H01L 29/0673; H01L 29/66439; H01L 29/775; H01L 27/0251
See application file for complete search history.

(56) References Cited

U.S. PATENT DOCUMENTS 6,800,910 B2*  10/2004  Lin ..................... H01L 29/1054
                                                257/347
6,970,373 B2*  11/2005  Datta .................... G11C 11/412
                                                257/E21.661

(Continued)

FOREIGN PATENT DOCUMENTS

CN    1753156 A    3/2006
CN    1799146 A    7/2006
(Continued)

*Primary Examiner* — Ida M Soward
(74) *Attorney, Agent, or Firm* — Bret E. Field; Bozicevic, Field & Francis LLP

(57) ABSTRACT

The present invention discloses a radiation-hardened-by-design (RHBD) multi-gate device and a fabrication method thereof. The multi-gate device of the present invention includes a substrate; a source region and a drain region, which are on the substrate; a protruding fin structure and a field dielectric layer between the source region and the drain region on the substrate; a gate dielectric and a gate electrode on the fin structure and the dielectric layer; and two isolation layers separated to each other, which are disposed in the drain region between the adjacent two fins, wherein an interlayer is sandwiched between the two isolation layers. The interlayer has a doping type which is opposite to that of the substrate so that a shunt PN junction is formed between the interlayer and the substrate, and the shunt PN junction has an electrode not connected to the drain so that a part of the charges collected by the shunt PN junction are not output to the drain and are ultimately guided out of the multi-gate devices, thereby weakening the influence of the single-event effect. In comparison with a multi-gate device of prior art, the multi-gate device of the present invention may effectively suppress the sensitivity of the device to single event irradiation in the event that the layout areas of the two types of devices are almost same.

6 Claims, 4 Drawing Sheets

(51) Int. Cl.
  *H01L 29/06* (2006.01)
  *H01L 27/02* (2006.01)
  *H01L 29/775* (2006.01)

(56) References Cited

U.S. PATENT DOCUMENTS

| | | | |
|---|---|---|---|
| 7,060,539 B2 * | 6/2006 | Chidambarrao | H01L 29/66795 438/142 |
| 7,279,375 B2 * | 10/2007 | Radosavljevic | H01L 29/41791 257/E21.444 |
| 7,528,465 B2 * | 5/2009 | King | H01L 21/84 257/401 |
| 8,698,128 B2 * | 4/2014 | Sleight | H01L 29/66477 257/24 |
| 2004/0266083 A1 * | 12/2004 | Hareland | H01L 29/1054 438/199 |
| 2007/0117306 A1 | 5/2007 | Oyamatsu | |
| 2007/0117311 A1 * | 5/2007 | Zaman | H01L 27/10844 438/253 |
| 2007/0210355 A1 * | 9/2007 | Izumida | H01L 29/6659 257/288 |
| 2007/0272925 A1 * | 11/2007 | Choi | H01L 27/1203 257/51 |
| 2008/0203491 A1 | 8/2008 | Anderson et al. | |
| 2009/0065869 A1 | 3/2009 | Ohguro et al. | |
| 2011/0278544 A1 * | 11/2011 | Bangsaruntip | B82Y 10/00 257/24 |
| 2014/0209854 A1 * | 7/2014 | Bangsaruntip | H01L 21/77 257/9 |

FOREIGN PATENT DOCUMENTS

| | | |
|---|---|---|
| CN | 101009291 A | 8/2007 |
| CN | 101707210 A | 5/2010 |
| CN | 101740569 A | 6/2010 |
| CN | 202394982 U | 8/2012 |
| CN | 102769016 A | 11/2012 |
| CN | 103219384 A | 7/2013 |

* cited by examiner (a)            (b)

(a)            (b)

(a)            (b)

(a)            (b)

US 9,508,852 B2

RADIATION-HARDENED-BY-DESIGN (RHBD) MULTI-GATE DEVICE

TECHNICAL FIELD

The invention refers to a field of single event effect for integrated circuit (IC), and particularly refers to a radiation-hardened-by-design (RHBD) multi-gate device and a fabrication method thereof.

BACKGROUND OF THE INVENTION

Under several decades of development in semiconductor integrated circuit IC technology, the circuit scale is getting larger, the feature size is getting smaller, and the density of integration is getting higher. In the nanometer scale, short-channel effect of a conventional planar device is getting worse, and is difficult to meet the requirements for the development of integrated circuit technology. A multi-gate device such as a fin field effect transistor (FinFET), as one of substitutes for the planar device, has attracted increasing attention, and has been applied in Intel 22mn technology. FinFET structure in prior art is shown in FIG. 1, comprising substrate 01; source region 06 and drain region 07, which are formed on the substrate and are positioned respectively at both ends thereof; a protruding fin structure 08 and a field dielectric layer 09, which extend between the source region and the drain region on the substrate; a gate dielectric layer 010 on both the fin structure and the field dielectric layer; and a gate electrode 011 over the gate dielectric layer. The multi-gate device usually comprises several parallel-connected fins, where a channel region is formed on each of portions of the fin structure in contact with the gate electrode, that is, the multi-gate device has a plurality of gates, which contributes to enhance of performance of the device. The gate may has a cross-section of various shapes, such as π type, Ω type, quadrilateral shape or cylindrical shape, etc., corresponding to the respective multi-gate devices of FinFET, Tri-gate-FET, Ω-FET, Gate-all-around FET, etc. However, in space or ground environment, multi-gate devices cannot yet avoid the influence of irradiation effects. Total ionizing Dose Effect (TID) mainly results in, by high-energy rays or particles, production of oxide trap charges in the oxide (such as $SiO_2$) and production of an interface state at the oxide/silicon interface, and thereby affects a threshold voltage so that the device performance is degraded. In comparison with a conventional planar device, due to different structures, no parasitic leakage passage may be formed between a source region and a drain region in a bulk silicon multi-gate device upon total dose irradiation, whereby the bulk silicon multi-gate device is total dose radiation hardened.

Although multi-gate devices have the good performance considering TID effect, but the influence of Single Event Effect (SEE) is still very serious. For example, in an n-channel bulk silicon multi-gate device, a reverse-biased PN junction is formed around a drain region, so the drain region is sensitive to single events when the device is in off-state (where a gate voltage $V_g$ and a source voltage $V_s$ are at a low potential, $V_d$ is at a high potential). The reverse-biased PN junction collects charges in a single-event ionization track and this may cause occurrence of a larger transient pulse current in the drain. When the device has a smaller size, the charges in the single-event ionization track may be collected by other sensitive nodes nearby through diffusion. Transient Pulses generated by irradiation may not be filtered during propagation, and if the pulse is propagated to a latch at an effective edge of the clock, an error information will be stored, causing the circuit state to upset. Because single-event effect is still serious in the small size of the multi-gate devices, RHBD is very important.

In the past, radiation hardening techniques are considered mostly from circuit level, such as adding filters or guard gate etc. Although the method is effective, the circuit layout area is increased by the added redundant components and the power consumption of the circuit may be increased. The layout-level hardening design can be common for the circuit such as memory cell, various hardening design methods have the respective particularities for the corresponding circuits.

SUMMARY OF THE INVENTION

To overcome the existing problems of the prior art, the present invention provides an improved multi-gate device, which may reduce a transient pulse current due to a single-event irradiation and reduce the charge collection.

An object of the present invention is to provide a radiation-hardened-by-design multi-gate device.

The radiation-hardened-by-design multi-gate device of the present invention comprises a substrate; a source region and a drain region, which are on the substrate and are positioned at both ends thereof, respectively; a protruding fin structure and a field dielectric layer between the source region and the drain region on the substrate; a gate dielectric on the fin structure and the field dielectric layer; a gate electrode covering the gate dielectric; two isolation layers separated to each other, which are disposed in the drain region between the adjacent two fins, wherein an interlayer is sandwiched between the two isolation layers.

A material for the isolation layer is an insulation dielectric such as silicon oxide or silicon nitride etc.

The interlayer sandwiched between the two isolation layers has a doping type which is the same as that of the source region and the drain region, and is opposite to that of the substrate.

In the bulk silicon multi-gate device, a material for the drain region is silicon. The multi-gate device comprises several parallel-connected fins, and the two isolation layers separated to each other are disposed in the drain region between the adjacent two fins so that fins each are connected respectively to a separated drain region, and fins all are connected to the same source region. A structure of isolation layer/interlayer/isolation layer between the adjacent two separated drain regions is a sandwich structure of insulation dielectric/silicon/insulation dielectric, and the silicon of the interlayer of the sandwich structure has a doping type which is opposite to that of the substrate, thereby a shunt PN junction is formed by the interlayer together with the substrate.

The Electrode of the shunt PN junction is led out by interconnection, and is not connected with any ports such as drain etc. During operation of the device, the shunt PN junction is reverse biased.

The silicon interlayer of the sandwich structure is doped opposite to the substrate so that the shunt PN junction is formed by the interlayer together with the substrate, and an n region of the shunt PN junction is connected to a high potential. During a normal operation, the PN junction is reverse biased without substantially influence on work current of the multi-gate device, that is, the presence of the shunt PN junction does not influence the normal work state of the multi-gate device.

If in a radiation environment, upon single-event irradiation of the multi-gate device in off-state, a large amount of charges are produced both in material of the drain region and in material of the substrate. In a multi-gate device of the prior art, such ionized charges are collected by the drain/substrate junction (the uncollected parts of these charges come into recombination) so that a current pulse is formed in the drain. For the multi-gate device proposed by the present invention, there are in total two types of structures (PN junction) functioning as collecting the ionized charges due to the single event, including: a drain/substrate PN junction and a shunt PN junction. The ionized charges are supposed to be constant with radiant flux being unchanged, and because the electrode of the shunt PN junction is not connected to the drain, a part of the charges collected by the shunt PN junction are not output to the drain and are ultimately guided out of the multi-gate device. Accordingly, the shunt PN junction has a function of shunting the ionized charge due to the single event, and thereby weakens the influence of the single-event effect.

The gate of a multi-gate device of the present invention may have a cross-section of various shapes, such as π type, Ω type, quadrangular shape or cylindrical shape, etc.

Another object of the present invention is to provide a fabrication method of a radiation-hardened-by-design multi-gate device.

A fabrication method of a radiation-hardened-by-design multi-gate device of the present invention comprises the steps of:

1) preparing a substrate;
2) forming an isolation layer;
3) patterning an active region;
4) forming a shallow trench isolation STI by depositing a thick oxide layer and performing etch-back;
5) forming gate dielectric and gate electrode by performing photolithography and etch;
6) performing ion implantation on source/drain extension region;
7) depositing gate sidewalls, and performing ion implantation on the source region and the drain region; and
8) performing ion implantation on interlayer.

Wherein, in the step 2), the forming of the isolation layer specifically comprises the steps of:

a) forming a buffer layer and a protective layer by thermal oxidation, and forming trench by performing photolithography and etch on the buffer layer, the protective layer and the substrate;
b) depositing a material for the isolation layer, and etching a redundant portion of the material for the isolation layer to form the isolation layer; and
c) epitaxial growing silicon, and subsequently forming the interlayer by polishing with chemical mechanical planarization;

In the step 3), the patterning of an active region comprises the steps of:

a) an area outlined by a dashed box being an area for the source region, the drain region and fin structures, etching oxide layer out of the area for the source region, the drain region and the fin structures;
b) forming the source region, the drain region, and the fin structures by etching silicon material out of the area for the source region, the drain region and the fin structures.

The present invention has the following advantages.

In the present invention, a shunt PN junction is formed between the separated drain regions, and because the shunt PN junction has an electrode disconnected to the drain, a part of the charges collected by the shunt PN junction are not output to the drain and are ultimately guided out of the multi-gate device, and thereby weakens the influences of the single-event effect. In comparison with a multi-gate device of prior art, the multi-gate device of the present invention may effectively suppress the sensitivity to single event effects in the event that the layout areas of the two types of devices are almost same.

DETAILED DESCRIPTION OF THE EMBODIMENTS

Hereinafter, a fin field effect transistor (FinFET) is taken as an example, and the embodiment of the present invention is described in detail in conjunction with the accompanying drawings.

Figure 2:
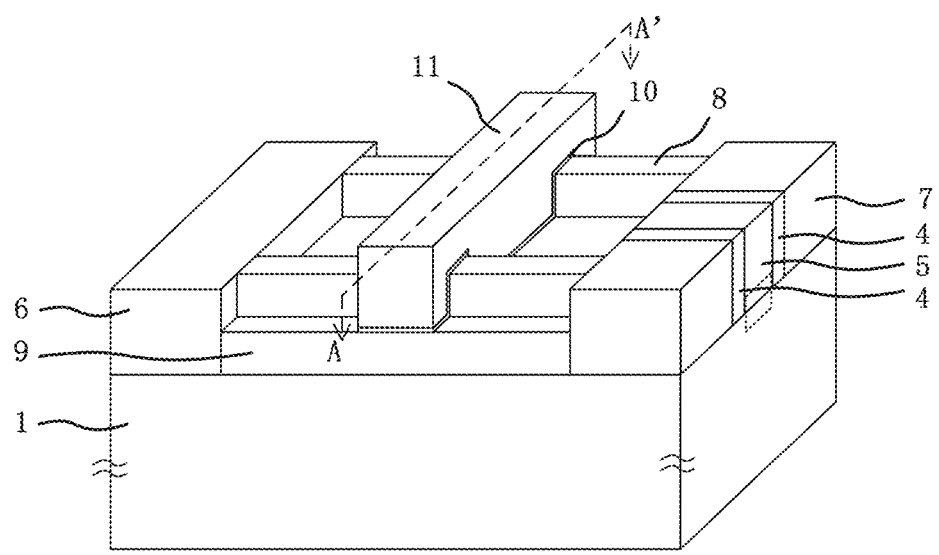
FIG. 2 is a structure schematic view of an embodiment of a radiation-hardened-by-design (RHBD) multi-gate device in accordance with the present invention.

As shown in FIG. 2, the multi-gate transistor of the present invention includes: a substrate 1; a source region 6 and a drain region 7, which are on the substrate 1 and are positioned respectively at both ends thereof; a protruding fin structure 8 and a field dielectric layer 9, which extend between the source region and the drain region on the substrate; a gate dielectric 10 on the fin structure and the field dielectric layer; a gate electrode 11 covering the gate dielectric; and two isolation layers 4 separated to each other, which are located in the drain region between the adjacent two fins, wherein an interlayer 5 is sandwiched between the two isolation layers 4.

In the FinFET of the present embodiment, the fin structure 8 is composed of two fins. The substrate 1 is a p type silicon wafer with a crystalline orientation <100>; the isolation layer 4 adopts silicon dioxide $SiO_2$; and a material for the interlayer is silicon Si with n-type doping. Each fin is connected to a separate drain region 7, and both fins are connected to the same source region 6; the field dielectric layer 9 on the substrate between the fins adopts silicon dioxide $SiO_2$; the gate dielectric 10 adopts silicon dioxide $SiO_2$; and the gate electrode 11 selects polysilicon. There is a sandwich structure $SiO_2/Si/SiO_2$ between the adjacent two separate drain regions, and the Si interlayer 5 in the sandwich structure is n-type doped, which is the same as the source region and the drain region and is opposite to the substrate and thereby a shunt PN junction is formed between the interlayer and the substrate, as indicated by a dashed box of FIG. 2. Electrode of the shunt PN junction is led out by interconnection, and is not connected to any ports such as drain etc. During operation of the device, the shunt PN junction is reverse biased.

Figure 1:
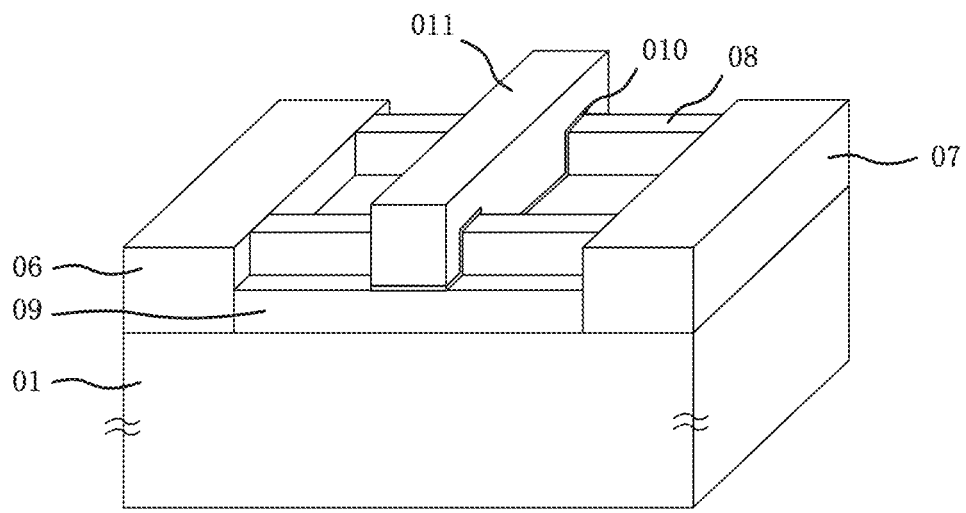
FIG. 1 is a structure schematic view of a multi-gate device such as fin field effect transistor (FinFET) in prior art.
Figure 3:
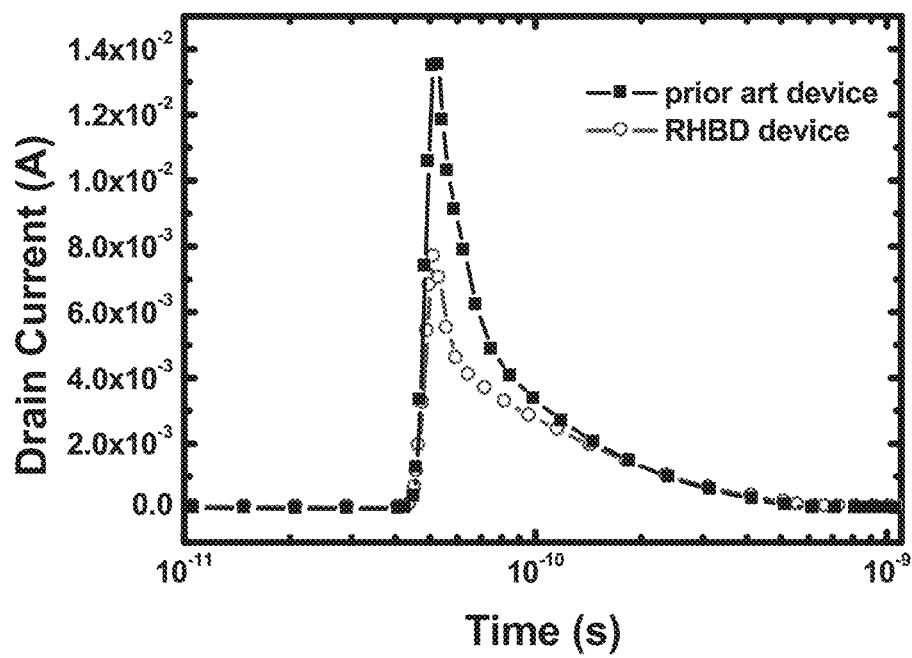
FIG. 3 is a graph illustrating transient pulses under single event irradiation in the multi-gate device of prior art and the multi-gate device of the present invention.

The silicon interlayer of the sandwich structure is doped with n-type impurities so that the shunt PN junction is formed between the silicon interlayer and the p-type substrate, and the n region of the PN junction is connected to a high potential. So in a normal operation, the PN junction is reverse biased without substantially influence on work current of the device, that is, the presence of the shunt PN junction does not influence a normal work state of the device. If in a radiation environment, upon single-event irradiation of an off-state device, a large amount of charges are produced both in the material of drain region and substrate. The ionized charges are supposed to be constant with radiant flux being unchanged, and because the shunt PN junction electrode is not connected to the drain, a part of the charges collected by the shunt PN junction are not output to the drain and are ultimately guided out of the multi-gate device. The shunt PN junction has a function of shunting the ionized charges due to the single event, and thereby weakens the influences of the single-event effect. FIG. 3 shows transient pulses of the FinFET of prior art and the FinFET of the present embodiment under the single-event irradiation, where the solid symbol in the graph denotes prior art, the open symbol denotes present invention. It is seen that present invention can effectively reduce the transient pulse. The present invention is characterized by that the shunt PN junction is added between the drain regions. In comparison with the FinFET of prior art in the FIG. 1, the multi-gate device of the present invention may effectively suppress the sensitivity to single event irradiation of the device in the event that the layout areas of the two types of devices are almost same.

Figure 4:
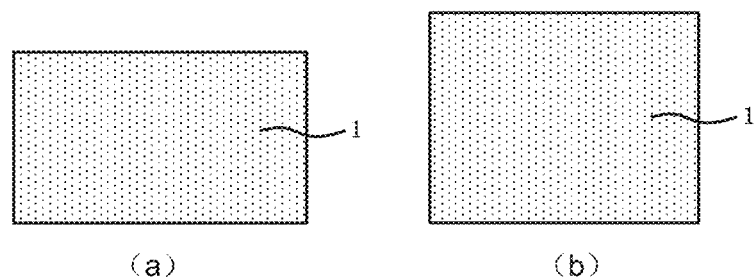
FIG. 4 to FIG. 11 are main steps of the process flow of an RHBD multi-gate device, wherein figure (a) of FIG. 4 to FIG. 11 are cross-sectional perspective views taken along A-A' direction of FIG. 2, and figure (b) of FIG. 4 to FIG. 11 are top views.
Figure 5:
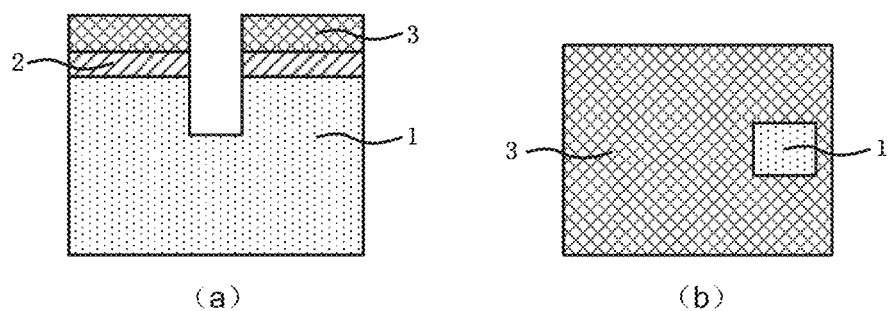
Figure 6:
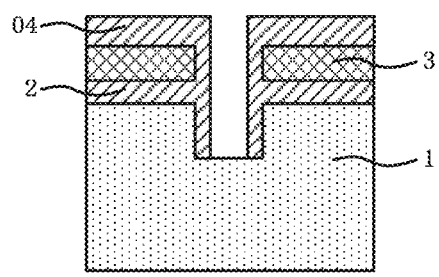
Figure 6:
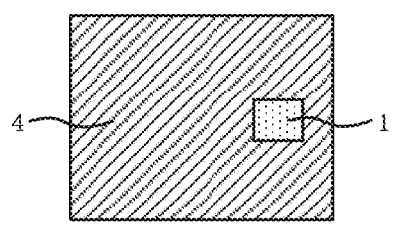
Figure 7:
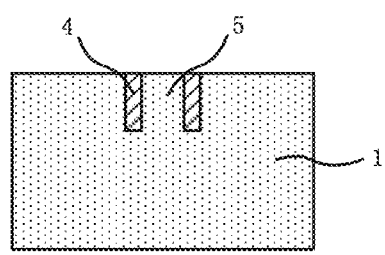
Figure 7:
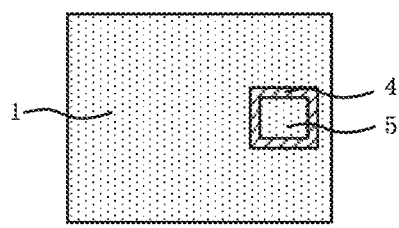
Figure 8:
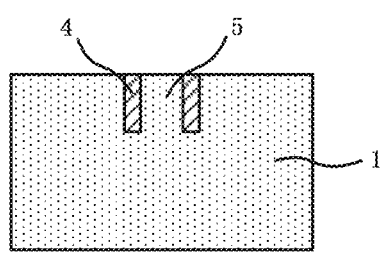
Figure 8:
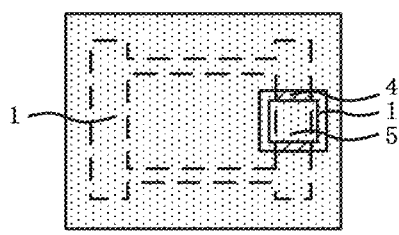
Figure 9:
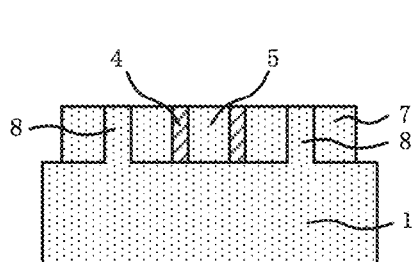
Figure 9:
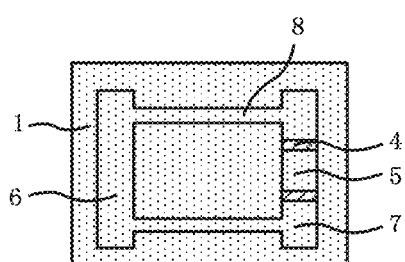
Figure 10:
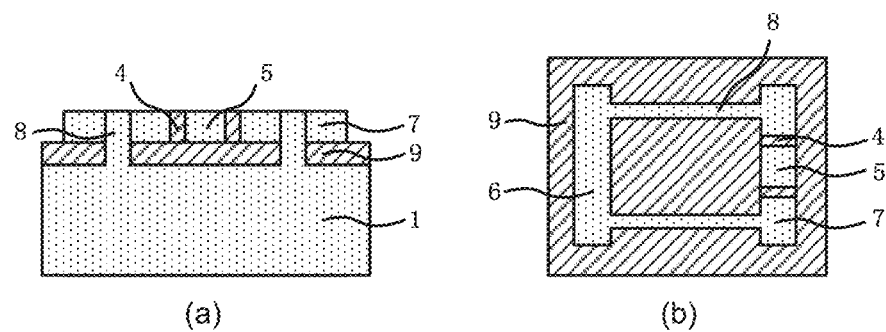
Figure 11:
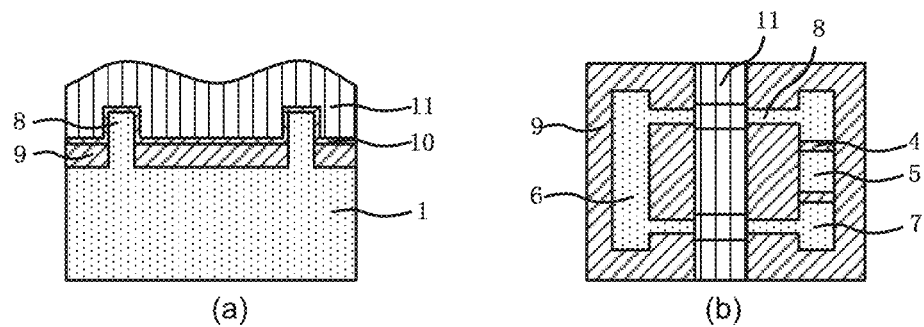

A fabrication method of a radiation-hardened-by-design multi-gate device of the present embodiment comprises the steps of:

1) preparing a substrate 1 of a p type silicon wafer with a crystalline orientation <100>, as shown in FIG. 4;

2) forming an isolation layer;

a) forming a buffer layer 2 of silicon oxide SiO$_2$ and a protective layer 3 of silicon nitride Si$_3$N$_4$ by thermal oxidation, and forming a trench by performing photolithography and etch on the buffer layer 2, the protective layer 3 and the substrate 1, as shown in FIG. 5;

b) depositing silicon oxide 04, as shown in FIG. 6 and etching redundant silicon oxide to form the isolation layer 4;

c) epitaxial growing silicon, and subsequently forming an interlayer 5 by polishing with chemical mechanical planarization, as shown in FIG. 7;

3) performing photolithography on an active region;

a) an area outlined by a dashed box being the area for a source region, a drain region and fin structures, etching oxide layer out of the dashed box, as shown in FIG. 8;

b) forming the source region 6 and the drain region 7 and the fin structure 8 by etching silicon material out of the dashed box, as shown in FIG. 9;

4) forming a shallow trench isolation (STI) 9 by depositing a thick oxide layer and performing etch-back, as shown in FIG. 10;

5) forming a gate dielectric 10 and a gate electrode 11 by photolithography and etching, as shown in FIG. 11;

6) performing ion implantation on an source/drain extension region;

7) depositing gate sidewalls, and ion implanting arsenic into the source region and the drain region;

8) performing ion implantation on the interlayer.

In the end, it should be noted that the embodiment has been described for the purpose of helping further understanding of the present invention. Various changes and modifications are possible within the scope of the accompanying claims. Accordingly, the present invention should not be limited to the content disclosed herein by the embodiments, the scope that the present invention intends to seek for is defined by the scope of the following claims.

What is claimed is:

1. A radiation-hardened-by-design (RHBD) multi-gate device, comprising: a substrate (1); a source region (6) and a drain region (7), which are on the substrate and are positioned respectively at both ends thereof; a protruding fin structure (8) having two adjacent fins and a field dielectric layer (9) between the source region and the drain region on the substrate; a gate dielectric (10) on the protruding fin structure and the field dielectric layer; a gate electrode (11) covering the gate dielectric; two isolation layers (4) separated from each other, which are located in the drain region between the two adjacent fins, wherein an interlayer (5) is sandwiched between the two isolation layers.

2. The multi-gate device according to claim 1, wherein the interlayer (5) has a doping type which is the same as that of the source region and the drain region and is opposite to that of the substrate (1).

3. The multi-gate device according to claim 2, wherein a shunt PN junction is formed by the interlayer together with the substrate, and electrode of the shunt PN junction is led out by interconnection, and is not connected to a port of the drain.

4. The multi-gate device according to claim 3, wherein n region of the shunt PN junction is connected to a high potential.

5. The multi-gate device according to claim 1, wherein a material for isolation layer (4) is an insulation dielectric such as silicon oxide or silicon nitride.

6. The multi-gate device according to claim 1, wherein the gate dielectric (10) has a cross-section of H type, Ω type, quadrilateral shape or cylindrical shape, etc.

* * * * *